(12) United States Patent
Karaiskaj

(10) Patent No.: US 9,753,102 B1
(45) Date of Patent: *Sep. 5, 2017

(54) SILICON-BASED MAGNETOMETER

(71) Applicant: University of South Florida, Tampa, FL (US)

(72) Inventor: Denis Karaiskaj, Wesley Chapel, FL (US)

(73) Assignee: UNIVERSITY OF SOUTH FLORIDA, Tampa, FL (US)

(*) Notice: Subject to any disclaimer, the term of this patent is extended or adjusted under 35 U.S.C. 154(b) by 642 days.

This patent is subject to a terminal disclaimer.

(21) Appl. No.: 14/190,656

(22) Filed: Feb. 26, 2014

Related U.S. Application Data

(60) Provisional application No. 61/770,597, filed on Feb. 28, 2013.

(51) Int. Cl.
*G01V 3/00* (2006.01)
*G01R 33/24* (2006.01)

(52) U.S. Cl.
CPC .................. *G01R 33/24* (2013.01)

(58) Field of Classification Search
USPC ........................................ 324/301
See application file for complete search history.

(56) References Cited

U.S. PATENT DOCUMENTS

| | | | | |
|---|---|---|---|---|
| 4,450,407 A | * | 5/1984 | Kwon | G01C 19/62 324/300 |
| 5,602,475 A | * | 2/1997 | Bohler | G01R 33/26 324/301 |
| 6,653,658 B2 | | 11/2003 | Burden | |
| 6,867,459 B2 | | 3/2005 | Burden | |
| 7,030,704 B2 | | 4/2006 | White | |
| 7,619,485 B2 | | 11/2009 | DeNatale et al. | |
| 7,852,163 B2 | | 12/2010 | Braun et al. | |
| 8,299,858 B2 | | 10/2012 | Gan | |
| 8,816,784 B1 | * | 8/2014 | Karaiskaj | G04F 5/14 331/3 |
| 9,052,698 B1 | * | 6/2015 | Karaiskaj | G04F 5/14 |
| 2010/0321117 A1 | * | 12/2010 | Gan | G04F 5/145 331/3 |
| 2011/0163291 A1 | * | 7/2011 | Scarsbrook | G06N 99/002 257/9 |
| 2013/0027034 A1 | * | 1/2013 | Elgort | G01R 33/26 324/301 |
| 2014/0306707 A1 | * | 10/2014 | Walsworth | G01R 33/1284 324/309 |

OTHER PUBLICATIONS

Wolfowicz, Gary, et al., "Atomic Clock Transitions in Silicon-Based Spin Qubits,", Nature Nanotechnology, vol. 8, Aug. 2013, pp. 561-564.

(Continued)

*Primary Examiner* — Rodney Fuller
(74) *Attorney, Agent, or Firm* — Thomas | Horstemeyer, LLP

(57) ABSTRACT

Systems and methods for a magnetometer comprise a single-isotope silicon crystal doped with impurity atoms. The Larmor precession associated with energy level transitions of the impurity atoms may be detected and used to measure an external magnetic field.

20 Claims, 7 Drawing Sheets

(56) References Cited

OTHER PUBLICATIONS

Yang A., Steger M., Karaiskaj D., Thewalt M. L. W., Cardona M., Itoh K. M., Riemann H., Abrosimov N. V., Churbanov M. F., Gusev A. V., Bulanov A. D., Kaliteevskii A. K., Godisov O. N., Becker P., Pohl H.-J., Ager J. W., and Haller E. E., "Optical Detection and Ionization of Donors in Specific Electronic and Nuclear Spin States" Phys. Rev. Lett. 97, 227401 (2006).

M. Steger, T. Sekiguchi, A. Yang, K. Saeedi, M. E. Hayden, M. L. W. Thewalt, K. M. Itoh, H. Riemann, N. V. Abrosimov, P. Becker, and H.-J. Pohl, "Optically-detected NMR of optically-hyperpolarized 31P neutral donors in 28Si" J. Appl. Phys. 109, 102411 (2011).

Steger M., Yang A., Thewalt M. L. W., Cardona M., Riemann H., Abrosimov N. V., Churbanov M. F., Gusev A. V., Bulanov A. D., Kovalev I. D., Kaliteevskii A. K., Godisov O. N., Becker P., Pohl H.-J., Haller E. E., and Ager J. W., "High-resolution absorption spectroscopy of the deep impurities S and Se in 28Si revealing the 77Se hyperfine splitting" Phys. Rev. B 80, 115204 (2009).

Sekiguchi T., Steger M., Saeedi K., Thewalt M. L. W., Riemann H., Abrosimov N. V., and Nötzel N., "Hyperfine Structure and Nuclear Hyperpolarization Observed in the Bound Exciton Luminescence of Bi Donors in Natural Si" Phys. Rev. Lett. 104, 137402 (2010).

Abe Eisuke, Tyryshkin Alexei M., Tojo Shinichi, Morton John J. L., Witzel Wayne M., Fujimoto Akira, Ager Joel W., Haller Eugene E., Isoya Junichi, Lyon Stephen A., Thewalt Mike L. W., and Itoh Kohei M., "Electron spin coherence of phosphorus donors in silicon: Effect of environmental nuclei" Phys. Rev. B 82, 121201(R) (2010).

A. R. Stegner, H. Tezuka, H. Riemann, N. V. Abrosimov, P. Becker, H.-J. Pohl, M. L. W. Thewalt, K. M. Itoh, and M. S. Brandt, "Correlation of residual impurity concentration and acceptor electron paramagnetic resonance linewidth in isotopically engineered Si" Appl. Phys. Lett. 99, 032101 (2011).

G. Feher, "Electron Spin Resonance Experiments on Donors in Silicon. I. Electronic Structure of Donors by the Electron Nuclear Double Resonance Technique" Phys. Rev. 114, 1219 (1959).

George Richard E., Witzel Wayne, Riemann H., Abrosimov N. V., and Nötzel N., Thewalt Mike L. W., and Morton John J. L., "Electron Spin Coherence and Electron Nuclear Double Resonance of Bi Donors in Natural Si", Phys. Rev. Lett. 105, 067601 (2010).

John J. L. Morton, Alexei M. Tyryshkin, Richard M. Brown, Shyam Shankar, Brendon W. Lovett, Arzhang Ardavan, Thomas Schenkel, Eugene E. Haller, Joel W. Ager, and S. A. Lyon, "Solid-state quantum memory using the 31P nuclear spin" Nature 455, 1085-1088 (2008).

G. W. Morley, M. Warner, A. N. Stoneham, P.T. Greenland, J.v. Tol. C.W. M. Kay, and G. Aeppli, "The initialization and manipulation of quantum information stored in silicon by bismuth dopants", Nat. Mat. 9, 725 (2010).

Hiroki Morishita, Eisuke Abe, Waseem Akhtar, Leonid S. Vlasenko, Akira Fujimoto, Kentarou Sawano, Yasuhiro Shiraki, Lukas Dreher, Helge Riemann, Nikolai V. Abrosimov, Peter Becker, Hans-J. Pohl, Mike L. W. Thewalt, Martin S. Brandt, and Kohei M. Itoh, "Linewidth of Low-Field Electrically Detected Magnetic Resonance of Phosphorus in Isotopically Controlled Silicon" Applied Physics Express 4, 021302 (2011).

Morishita H., Vlasenko L. S., Tanaka H., Semba K., Sawano K., Shiraki Y., Eto M., and Itoh K. M., "Electrical detection and magnetic-field control of spin states in phosphorus-doped silicon" Phys. Rev. B 80, 205206 (2009).

W. Akhtar, H. Morishita, L.S. Vlasenko, D.S. Poloskin, and K. M. Itoh, "Electrically detected magnetic resonance of phosphorousduetospin dependent recombination with triplet centers in g-irradiated silicon" Physica B 404, 4583 (2009).

Yang A., Steger M., Sekiguchi T., Karaiskaj D., Thewalt M. L. W., Cardona M., Itoh K. M., Riemann H., Abrosimov N. V., Churbanov M. F., Gusev A. V., Bulanov A. D., Kovalev I. D., Kaliteevskii A. K., Godisov O. N., Becker P., Pohl H.-J., Ager J. W., and Haller, E. E., "Single-frequency laser spectroscopy of the boron bound exciton in 28Si" Phys. Rev. B 80, 195203 (2009).

Steger, et al., Quantum Information Storage for over 180s Using Donor Spins in a 28Si Semiconductor Vacuum; Jun. 8, 2012, vol. 33, Science AAAS.

Michael Thewalt, Abstract Submitted for the Mar. 13 Meeting of The American Physical Society., Nov. 12, 2012.

George, et al., "Electron Spin Coherence and Electron Nuclear Double Resonance of Bi Donors in natural Si", Physical Review Letters 105.6 (2010): 067601, pp. 1-4.

Tyryshkin, et al., "Coherence of Spin Qubits in Silicon", Journal of Physics: Condensed Matter 18.21 (2006): S783-S93.

Taylor, J.M., et al., "High-Sensitivity Diamond Magnetometer with Nanoscale Resolution,", Nature Physics, vol. 4, Oct. 2008, pp. 810-817.

Maze, J R., et al., "Nanoscale Magnetic Sensing with an Individual Electronic Spin in Diamond,", Nature Letters, vol. 455, Oct. 2, 2008, pp. 644-648.

Maletinsky, P., et al., "A Robust Scanning Diamond Sensor for Nanoscale Imaging with Single Nitrogen-Vacancy Centres," Nature Nanotechnology, Letters, vol. 7, May 2012, pp. 320-324.

Budker, Dmitry, et al., "Optical Magnetometry,", Nature Physics, vol. 3, Apr. 2007, pp. 227234.

* cited by examiner

SILICON-BASED MAGNETOMETER

CROSS-REFERENCE TO RELATED APPLICATIONS

This application claims priority to U.S. Provisional Application Ser. No. 61/770,597, filed Feb. 28, 2013, which is hereby incorporated by reference herein in its entirety.

BACKGROUND

Magnetic field sensors may be used to exploit a wide range of physical phenomena. Applications may range from sensing of the positioning of a moving metallic component in a machine to the detection of very weak magnetic fields produced by biological systems. Current magnetic field sensors, or magnetometers, include inductive pick-up coils, Hall probes, magnetoresistive elements, magneto-optic devices, flux-gates, superconducting quantum interference devices (SQUIDS), and atomic magnetometers. Magnetometers are typically characterized by their sensitivity, vector or scalar operation, bandwidth, heading error, size, weight, power, cost, and reliability.

Two types of highly sensitive magnetometers are SQUIDs and atomic magnetometers. SQUIDs have a high sensitivity, but require cryogenic cooling to operate. Due to the requirement for liquid gases for cooling, SQUIDs are large devices. Unlike SQUIDS, atomic magnetometers can reach very high sensitivity without requiring cryogenics. As such, atomic magnetometers do not have the size limitation of SQUIDs. Atomic magnetometers are used most frequently for the detection of magnetic anomalies produced by metallic objects such as geophysical structures, vehicles, and ships. Some applications for atomic magnetometers may also include, for example, detection of biomagnetic signals, nuclear magnetization, and magnetic particles. However, atomic magnetometers operate by measuring the changes of properties in a particular atomic gas that is contained within a small glass chamber. As such, the robustness of atomic magnetometers is limited.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1A:
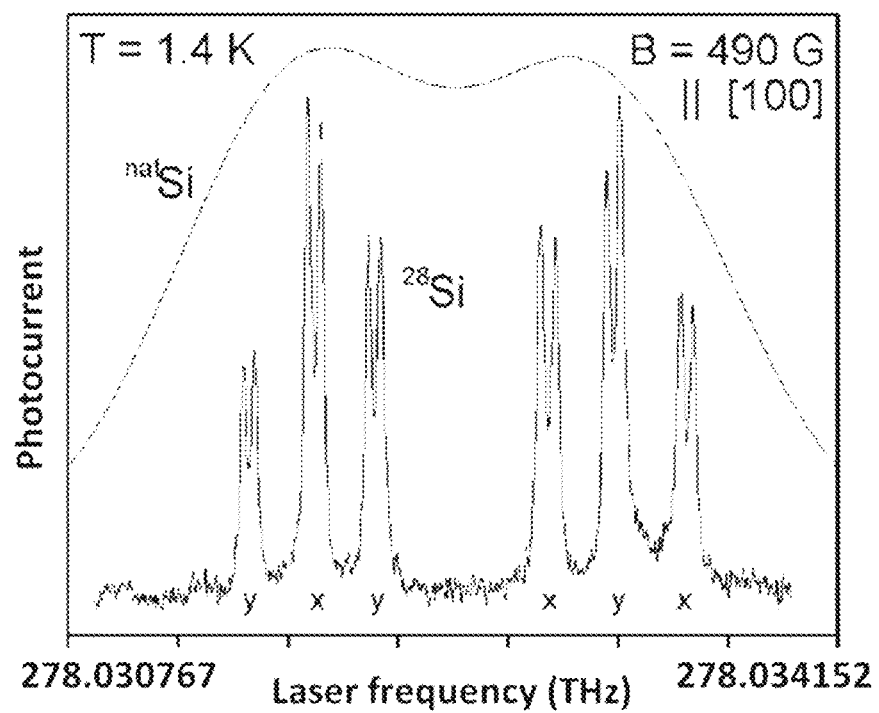
FIG. 1A is a graph that shows the Zeeman spectrum of phosphorus bound exciton, no-phonon transitions in a sample of 99.991% $^{28}$Si.

As can be appreciated from the above discussion, a highly sensitive, more portable, and robust magnetometer is desired for sensitive magnetic field measurement applications. This disclosure relates to measuring magnetic fields using the spin coherence of impurities often found in silicon. For example, the spin coherence of the phosphorus impurities in an isotopically enriched $^{28}$Si has been measured to be 192 seconds. A magnetometer based on this long spin coherence should surpass in sensitivity all existing magnetometers, including SQUIDs and atomic magnetometers.

The transitions and the hyperfine splitting of the donors and acceptors in natural and isotopically enriched silicon are imperative to the implementation of a silicon-based magnetometer. Of particular interest are the impurities in silicon from donors Phosphorus P and Bismuth Bi in their natural or ionized forms. These transitions could be detected optically or electrically. In addition, the transitions may be detected from silicon that is at room temperature, thermo-electrically cooled, or cooled by liquid gases. In addition, the size of the silicon crystal may be reduced in the nanometer scale in order to reduce phonon scattering. By implementing these features, a highly sensitive and robust silicon based magnetometer may be constructed.

In the following disclosure, various specific embodiments are described. It is to be understood that those embodiments are example implementations of the disclosed inventions and that alternative embodiments are possible. All such embodiments are intended to fall within the scope of this disclosure.

Similar to atomic gases used in atomic magnetometers, impurity transitions in silicon show several hyperfine transitions. Atomic magnetometers rely on a measurement of the Larmor precession of spin polarized atoms in a magnetic field. The Larmor frequency is given by $$\omega_L = \gamma B$$

where $\gamma$ is the gyromagnetic constant of the atom and B is the local magnetic field. Atomic (or optical) magnetometers are based on the measurement of the Larmor precession by use of an optical field tuned to an appropriate optical transition in the atoms. While the measurement of the resonant Larmor precession is commonly used to monitor the magnetic fields, there is also a "low-field" mode of operation, in which a weak magnetic field simply reorients the atomic spin slightly without causing a resonant precession. This regime is achieved when the atomic spin relaxation rate is much larger than the Larmor precession rate. The fundamental shot-noise limited sensitivity of an atomic magnetometer is given by $$\delta B = \frac{1}{\gamma \sqrt{n T_2 V t}}$$

where n is the number of density of atoms, $\gamma$ is the gyromagnetic ratio, $T_2$ is the transverse spin relaxation time, V is the measurement volume, and t is the measurement time. The value $\gamma$ depends on the details of the magnetometer operation. For a commonly used Zeeman transition with $\Delta m=1$, $\gamma=g\mu_B/\hbar(2I+1)$, where I is the nuclear spin of the alkali metal, $\mu_B$ is the Bohr magneton, and $g\approx 2$. The sensitivity of most atomic magnetometers is limited ultimately by alkali-alkali collisions. Since the signal from the atoms is proportional to the number of atoms, at low alkali densities, the signal-to-noise ratio and sensitivities improve as the atom density at fixed volume increases. However, at a certain density alkali-alkali spin exchange or spin destruction, collisions begin to broaden the magnetic resonance. Therefore, any gains in sensitivity created by the increased atom number are offset by the correspondingly broader resonance. When the density of alkali atoms is very high and the Larmor precession frequency is very small (i.e., weak magnetic fields), the alkali spins no longer relax due to spin exchange, but only via much weaker spin destruction processes. This effect has been used to great advantage in magnetometry: the suppression of spin exchange broadening can lead in the case of $^{39}$K to magnetometers sensitivities up to one hundred times better than can be achieved under spin exchange broadened conditions.

Sensing magnetic fields is an important application that may be based on and expanded by the impurity transitions of isotopically enriched silicon. Using similar detection methods as in atomic magnetometers, the spin precision of donor impurities in $^{28}$Si can be used to measure magnetic fields.

The nuclear spin of neutral donor impurities in silicon has been identified as a promising qubit candidate because of its long $T_2$, as well as the possibility of control and readout via its hyperfine coupling to the neutral donor ($D^0$) electron spin. The elimination of the 4.6% of $^{29}$Si (with nuclear-spin quantum number I=½) present in natural Si removes a primary decoherence mechanism for the donor electron spin. However, enriched $^{28}$Si has another crucial advantage resulting simply from the mass differences between the three stable isotopes. In particular, the ability to resolve the hyperfine splitting of the $D^0$ ground stated in transitions between $D^0$ and the neutral donor bound exciton (D0X) in $^{28}$Si is pertinent to the spin polarization and detection methods used in quantum computational studies and magnetometry applications.

Due to at least these characteristics, $^{28}$Si may be thought of as a "semiconductor vacuum" with properties almost identical to those of Si but with almost no nuclear spins and optical linewidths approaching their homogeneous, lifetime limited values. Isotopically enriched $^{28}$Si not only provides a nuclear—spin-free environment, which leads to long $T_{2e}$ and $T_{2n}$, but also permits a method for spin polarization and detection allowing exploration of magnetic resonance of donors at densities below $10^{12}$ cm$^{-3}$. The resulting coherence times exceed those of other solid-state systems and are comparable to the longest measured for isolated atoms and ions in vacuum.

Due to the properties of the isotopically enriched $^{28}$Si, a magnetometer comprising isotopically enriched $^{28}$Si should be operable at room temperature. However, implementation of this material at even a low temperature can exceed the sensitivity of a SQUID magnetometer, which operates at liquid helium temperature. Not only will the isotopically enriched $^{28}$Si have a longer coherence time at cryogenic temperatures, the removal of the hyperfine-coupled electron results in a change in the temperature dependence of $T_2$. For the neutral donor, the electron $T_1$ decreases very rapidly with increasing temperature and, even at 4.2K, the nuclear $T_2$ is limited by the electron $T_1$. This mechanism is absent for the ionized Donor $D^-$. As such, long nuclear coherence times may still be present at room temperature.

Another advantage that silicon offers is the ability to detect the Larmor precession electrically, without the need for photodetectors. This is possible due to the non-radiative Auger recombination that governs these transitions. Something that would normally lower the emission efficiency and, as a result, the signal-to-noise ratio, can be used at great advantage in implementing a silicon-based magnetometer. The non-radiative recombination processes are phonon assisted. Therefore, higher temperatures, while weakening the emission, could improve the signal-to-noise ratio without necessarily significantly broadening the hyperfine resonance.

Example materials, systems, and methods for generating magnetometers based upon transitions in isotopically enriched silicon are described below.

FIG. 1A shows the Zeeman spectrum of the phosphorus bound exciton, no-phonon transitions in a silicon sample enriched to 99.991% $^{28}$Si. The photoluminescence excitation spectra at T=1.4 K with a magnetic field of 490 G parallel to the [100] axis are shown in the figure. The same spectra obtained in silicon of natural isotopic composition ($^{nat}$Si) are also shown in the figure for purposes of comparison.

Figure 1B:
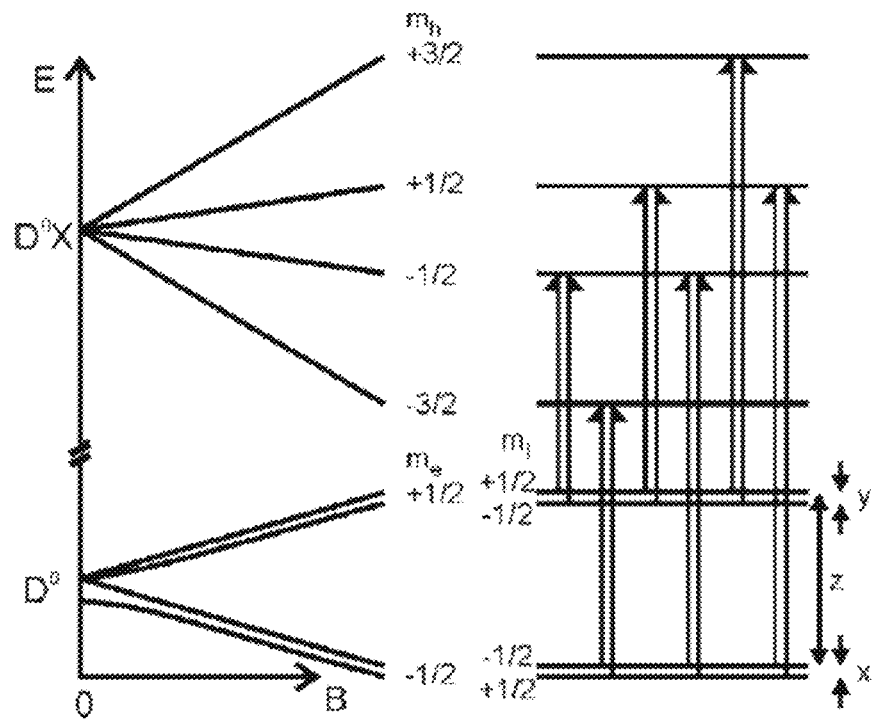
FIG. 1B is a level scheme describing the origin of the transitions of FIG. 1A.

FIG. 1B is a level scheme describing the origin of the transitions (six doublets) shown in FIG. 1A. $D^0$, the neutral donor, is the ground state of the phosphorus bound exciton. $D^0$ has a zero-field hyperfine splitting of 0.12 GHz and, under an applied magnetic field, splits into four hyperfine levels (shown on the right) determined by the projections of the electron spin $m_e=\pm\frac{1}{2}$ and the nuclear spin $m_I=\pm\frac{1}{2}$. The donor bound exciton $D^0X$ has two electrons in a spin singlet and, under a magnetic field, splits only according to the j=3/2 hole projections. The six allowed transitions are ordered in increasing energy from left to right, in correspondence with the transitions on the left side of the figure.

In the disclosed systems and methods, the energy level transitions of impurities often found in silicon (Si) are used to measure the Larmor precession and ultimately determine the magnetic field. Silicon in the naturally-occurring isotopic composition consists of 92.23% $^{28}$Si+4.67% $^{29}$Si+3.10% $^{30}$Si. Therefore, the importance of inhomogeneous isotope broadening effects in setting many of the broadening limits in natural silicon was at first surprising given that natural silicon is close to monoisotopic. However, the vast majority of impurity transitions in natural silicon were found to be dominated by isotopic broadening. In addition to significantly broadening the donor and acceptor transitions in the far and near infrared, the isotopic randomness was the origin of the splitting of the ground state of acceptors in silicon. A theoretical framework was developed that provided clear insights on how the isotopic randomness splits the fourfold degenerate ground state of acceptors in natural silicon into doublets. The removal of this remaining source of broadening revealed that impurity transitions in silicon are "atomic like." Therefore, the isotopically purified/enriched versions $^{28}$Si, $^{29}$Si, and $^{30}$Si, and in particular the abundant $^{28}$Si isotope, could be doped at approximately $10^{12}$ to $10^{14}$ cm$^{-3}$ with donors or acceptors, and effectively used for magnetic field measurements.

It should be noted that the theoretical modeling used to reproduce the splitting of the acceptor ground state predicts only a small energy shift to the transitions of individual donor impurities (and a splitting of the ground state for acceptors). The broadening observed spectroscopically is a result of statistical averaging over a large ensemble of impurities. Therefore, isolating individual donor impurity atoms in silicon crystals of natural isotopic composition would have a similar effect as removing the isotopic randomness. In principle, all the transitions of donors and acceptors in natural and isotopically-enriched silicon, including and their hyperfine splitting, could be used to measuring a magnetic field.

Donors and acceptor impurities in silicon, with few exceptions such as the phosphorus $^{31}P$, come in different isotopes. For example, the most common acceptor, boron, has two isotopes in the natural occurrence $^{10}B$ and $^{11}B$, with a ratio of 80% to 20%. The impurity atoms used could be in their natural occurrence or single isotope such as boron ($^{11}B$). There is a shift in the ionization energy for each of the isotopes, therefore, using single-isotope impurities may be desirable.

Figure 2A:
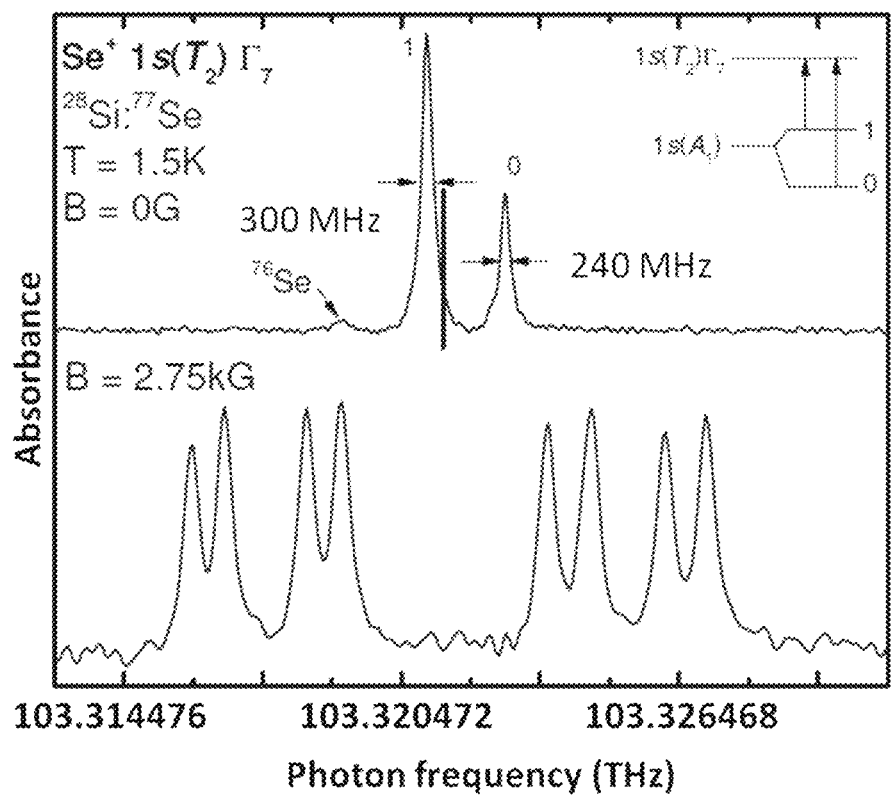
FIG. 2A is a graph that shows the spectra of $^{77}$Se$^+$ 1s(T$_2$) $\Gamma_7$ transition in $^{28}$Si.
Figure 2B:
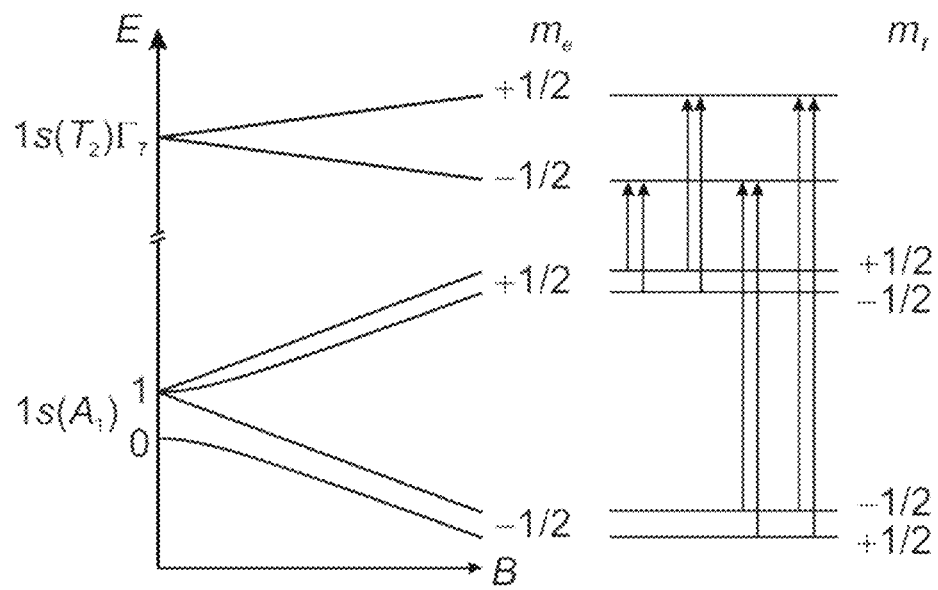
FIG. 2B is a level scheme describing the origin of the transitions of FIG. 2A.

FIG. 2A shows the spectra of the $^{77}Se^+$ $1s(T_2)$ $\Gamma_7$ transition in $^{28}Si$. Illustrated in the top of FIG. 2A are the spectra without an external magnetic field showing the ground-state hyperfine splitting. The spectra show extremely narrow lines with a full width at half maximum (FWHM) of 240 MHz. Residuals of the $^{76}Se$ can be seen and the vertical line is located halfway between the $^{76}Se$ and $^{78}Se$ energies. In the bottom of the FIG. 2A are the spectra under a 2750 G magnetic field. Four doublets are observed. FIG. 2B is a level diagram for the $^{77}Se^+$ $1s(T_2)$ $\Gamma_7$ transitions indicating the origin of the eight components shown in the bottom of FIG. 2A.

Impurity Transitions of Interest

Impurity transitions may be used for magnetic field measurement applications. Impurity atoms that contribute free electrons to the host crystal are known as donors, whereas atoms that remove electrons (or create holes) are known as acceptors. The transitions used to detect the Larmor frequency could originate from (1) a neutral donor or acceptor in natural or isotopically-enriched silicon or (2) excitons (electron-hole pairs) bound to neutral donors or acceptors in natural or isotopically-enriched silicon, called impurity bound excitons. Substitutional group-V atoms include phosphorus (P), arsenic (As), and antimony (Sb), and interstitial monovalent atoms include lithium (Li) and sodium (Na). The group-V atoms have one more valence electron than the silicon atom they replace. Furthermore, this electron is loosely bound to the group-V atom in silicon so that it can be easily excited into the conduction band of the host silicon crystal. Substitutional group-VI atoms include sulfur (S), selenium (Se), and tellurium (Te). The group-VI atoms can contribute up to two electrons and are known as double donors.

Boron (B), gallium (Ga), indium (In), and aluminum (Al) are shallow acceptors in silicon. All of these atoms belong to group III of the periodical table and have one less valence electron than silicon. Therefore, when these atoms substitute a silicon atom they create a hole that is loosely bound to the negatively-charged acceptor. Substitutional group-II atoms such as beryllium (Be) and zinc (Zn) in silicon can contribute two positive charges to the host crystal and are called double acceptors. Deeper impurities like gold (Au), silver (Ag), platinum (Pt), and copper (Cu) are more likely to remain neutral at room temperature, and therefore can be ionized or neutralized using optical excitation.

Neutral Donor and Acceptor Transitions

The discrete states of the donor electron are classified according to their principal quantum number n, angular momentum l, and spin. In atomic physics, these states are denoted as 1s, 2s, 2p, etc. and similar notations are used to denote the bound states of shallow impurities. These transitions typically need to be interrogated in the far infrared.

Figure 3A:
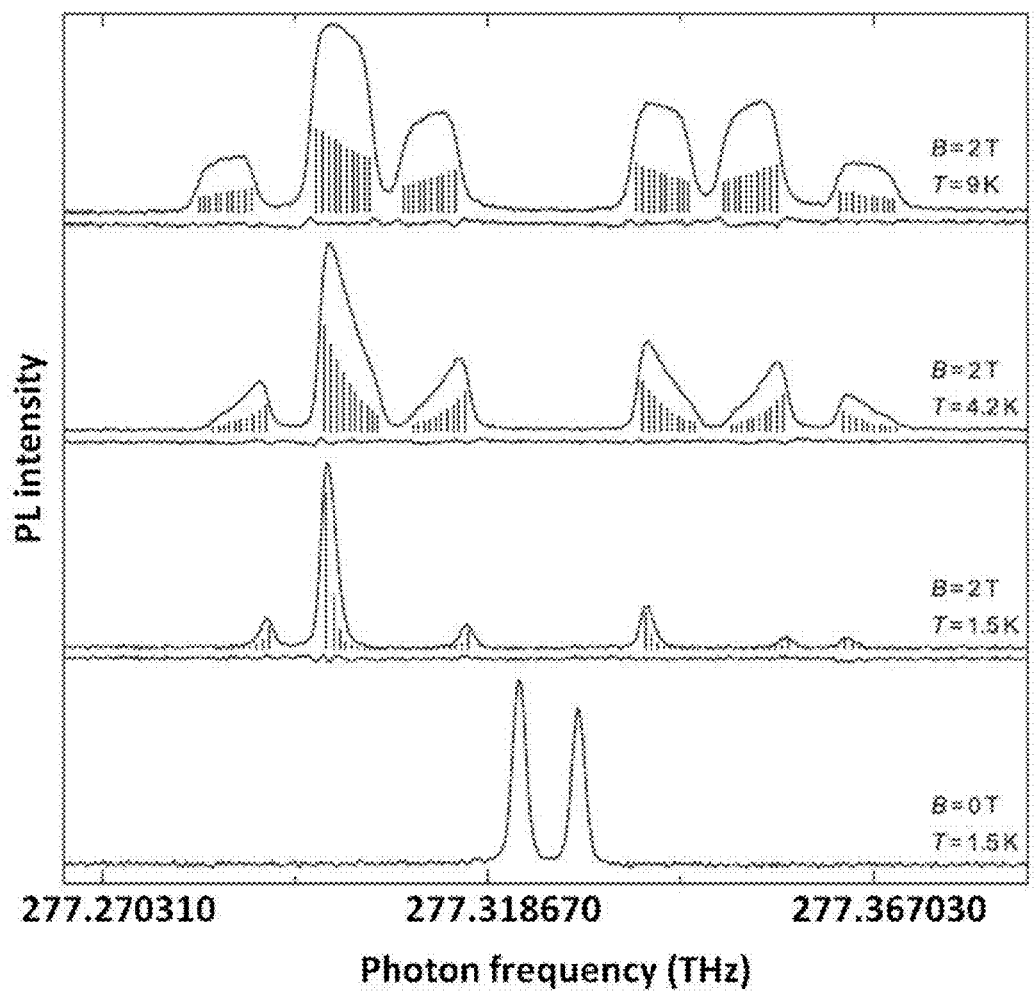
FIG. 3A is a graph of photoluminescence of bismuth no-phonon bound exciton D$^0$X transitions within single-isotope silicon at zero magnetic field and at 2 Tesla.
Figure 3B:
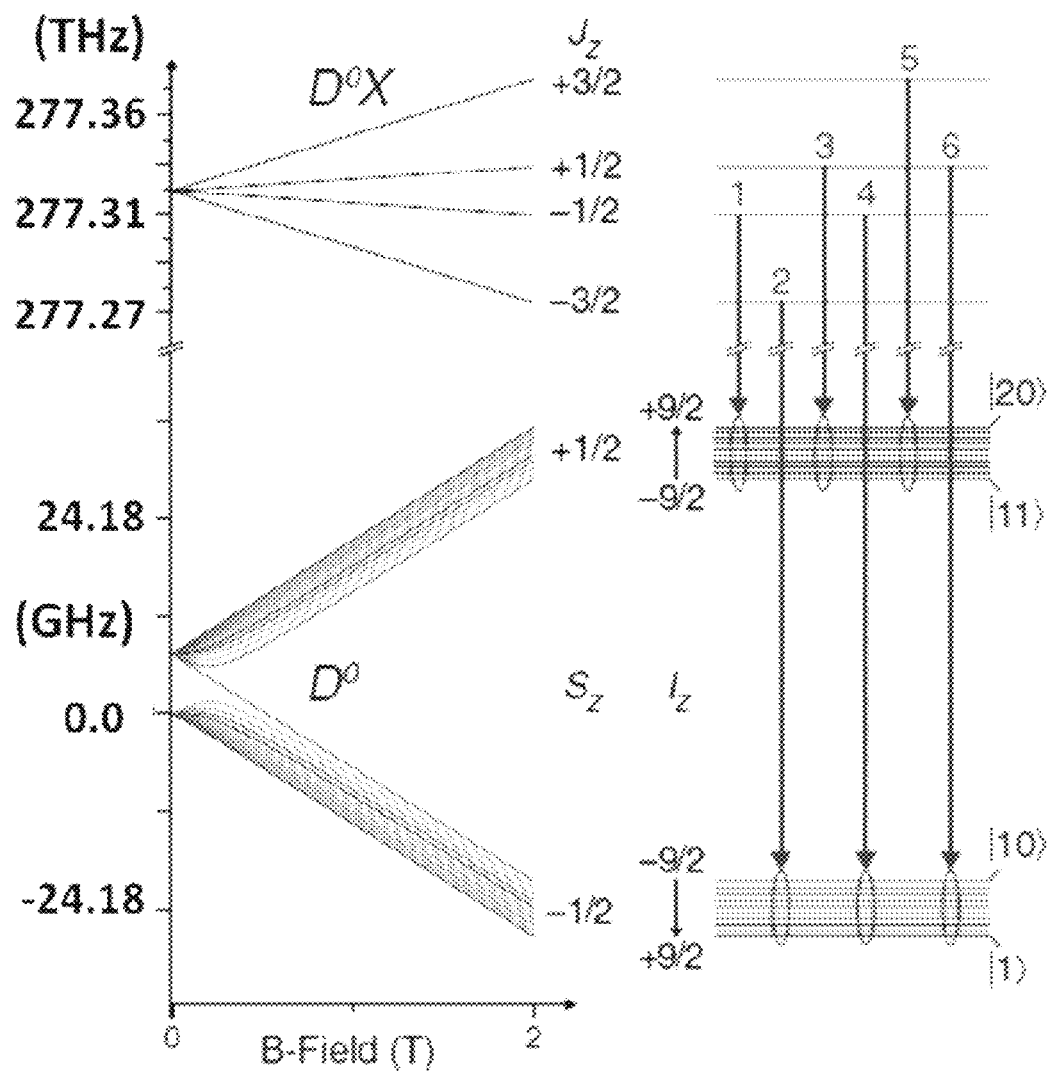
FIG. 3B is a level scheme describing the transitions of FIG. 3A indicating the origin of the photoluminescence structure at the zero and 2 Tesla magnetic fields.

FIG. 3A shows the photoluminescence of the bismuth (Bi) no-phonon bound exciton $D^0X$ transitions at zero magnetic field and at 2 Tesla for different temperatures. The vertical lines in the figure indicate the relative strengths of individual hyperfine components. FIG. 3B shows Zeeman level diagrams for the transitions from the bismuth bound exciton $D^0X$ to the neutral donor $D^0$ indicating the origin of the photoluminescence structure at zero and 2 Tesla magnetic field. $J_z$ identifies the hole angular momentum projections in $D^0X$, whereas $S_z$ and $I_z$ identify electron and nuclear spin projections in $D^0$, respectively. The allowed transitions at 2T are identified on the right in order of increasing energy, with each having ten hyperfine components.

No-Phonon Transitions of Impurity Bound Excitons

When the silicon crystal contains a small number of donors and acceptors in their neutral state, the excitons will be attracted to these impurities. Because this attraction lowers the exciton energy, neutral impurities at low temperatures are very efficient at trapping excitons to form the impurity bound excitons. The impurity bound exciton is a multi-particle system. The case of an exciton bound to donors comprises two interacting electrons and one hole, whereas the case of one electron bound to a neutral acceptor comprises two interacting holes and one electron. In silicon, electrons at the conduction band minimum and holes at the valence band maximum can recombine by emission of a characteristic photon. Silicon is an indirect bandgap semiconductor, i.e., the maximum of the valence band and minimum of the conduction band are not at the same position in k-space. Therefore, electrons and holes can recombine and emit a photon with the help of k-vector conserving phonon. When a phonon fulfills the k-vector conservation requirement, the transition is called phonon assisted. However, it is possible for impurity bound excitons to have no-phonon transitions, i.e., transitions that do not invoke a k-vector conserving phonon. The spatial localization of the exciton to the impurity site in real space leads to a greater delocalization/diffusiveness of the electron and hole wave functions in k-space. This leads to an overlap of the electron and hole wave functions, thus permitting electron-hole transitions that conserve the k-vector. The intensity of no-phonon transitions will therefore increase with increasing localization energy.

Figure 4:
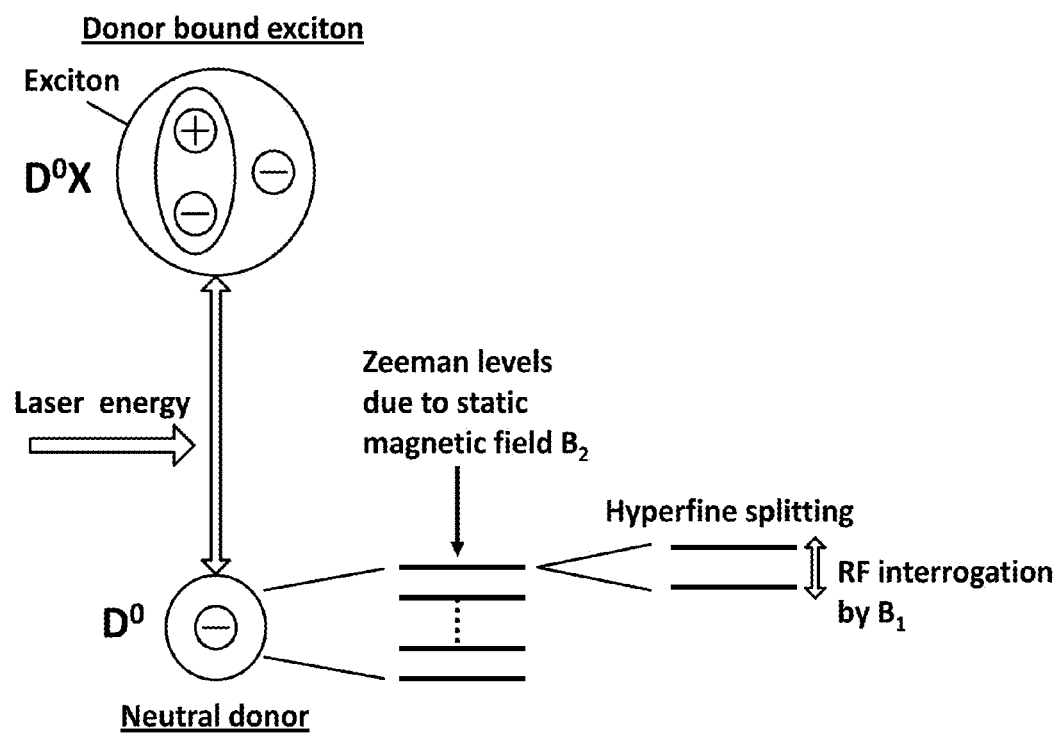
FIG. 4 is a schematic drawing that illustrates a no-phonon bound exciton transition that can be used in measuring a magnetic field.

FIG. 4 shows a schematic of a no-phonon impurity bound exciton transition that can be used in detecting a magnetic field. The donor bound exciton is the excited state of the system, which can be optically excited by a frequency-stabilized laser, such as a vertical cavity surface-emitting laser (VCSEL). The Coulomb-bound electron-hole pair recombines leaving the neutral donor behind. A small static magnetic field $B_2$ splits the donor ground state into its Zeeman sublevels, which are further split by the hyperfine interaction. A small coil can be used to provide a field (e.g., radio frequency (RF) field) $B_1$ that is used to interrogate the hyperfine resonance.

Greater localization of the electrons and holes in real space implies greater delocalization/diffusiveness in k-space. As a result, deeper impurities with higher ionization energy will have stronger no-phonon transitions than shallower impurities. No-phonon transitions of impurity bound excitons in silicon can be exceedingly narrow. Phonon-assisted transitions will, in general, be broader than no-phonon transitions because of the dispersion in the phonon spectrum. In donor bound exciton transitions, one electron and hole forming the exciton recombine leaving a neutral donor behind, whereas in the acceptor bound exciton, one electron and hole recombine leaving a neutral acceptor behind. The neutral donor is split in the magnetic field into the projections of the electron spin $m_e=\pm\frac{1}{2}$, whereas the neutral acceptor is split according the hole angular momentum j=3/2. Therefore, acceptor bound exciton transitions, generally, have a more complicated structure. Because of the narrowing of the bound exciton transitions and the absence of the nuclear spin in isotopically enriched $^{28}$Si, the splitting due to the hyperfine interactions with the nuclear spin of the impurity atom can be clearly resolved. Similar to atomic transitions, such as the rubidium (Rb) or cesium (Cs) standards, the Larmor precession of hyperfine splitting of impurity bound exciton transitions in silicon can used be for sensing magnetic fields.

Examples of Impurity Atoms and Transitions for Magnetometers

Candidates for transitions will now be discussed. Donor bound exciton transitions are usually narrower than the acceptor counterparts and have a simpler structure. The phosphorus donor impurity can be easily introduced in silicon, which makes this a desirable impurity. The no-phonon homogeneous linewidth of the bound exciton in isotopically-pure silicon was measured to be approximately 2.4 MHz at a magnetic field of 440 G, which is only twice the lifetime limited linewidth set by the $^{31}$P bound exciton lifetime of 272 ns. The zero-field hyperfine splitting is 117.53 MHz, whereas at zero field the linewidths amount to 70 neV. $^{31}$P has a l=½ nuclear spin as compared to the l=3/2 for $^{87}$Rb and l=7/2 for $^{133}$Cs, leading to a simpler hyperfine splitting. The phosphorus-bound exciton transitions in isotopically enriched $^{28}$Si and silicon of natural isotopic composition $^{nat}$Si are shown in FIG. 1A. The difference between the spectra reveals the importance of the isotopic broadening. A schematic describing the origin of the six doublets observed in $^{28}$Si is also shown. Each doublet in the spectra is determined by the projections of the electron spin $m_e=\pm\frac{1}{2}$ and hole angular momentum j=3/2, whereas the doublet splitting is a result of the hyperfine interactions.

Another impurity with a significantly larger hyperfine splitting is the selenium double donor. Chalcogens such as selenium give rise to a number of different donor centers in silicon. These centers can involve one, two, or more selenium atoms and can be either neutral or ionized. Because of their deep nature, the 1s state can have transitions that are not observed for shallow donors. The donor atom occupying the tetrahedral lattice site has a sixfold degenerate s state, which can be split by the central cell potential into a singlet ($A_1$), a triplet ($T_2$), and a doublet (E) or ($\Gamma_6$), ($\Gamma_8$), and ($\Gamma_7+\Gamma_8$) including spin. The valley orbit splitting is strongest for the 1s state. The transition from the 1s($A_1$) to 1s($T_2$) is effectively mass theory forbidden but symmetry allowed. The fact that this transition is only partially allowed contributes to its long lifetime and therefore to a narrow linewidth of approximately 240 MHz, making it possible to resolve the $^{77}$Se hyperfine splitting using this final state. The hyperfine splitting would be obscured by the isotopic broadening in natural silicon and therefore is only observable in isotopically enriched $^{28}$Si. In addition, selenium has more than one isotope and the dopant itself has been enriched to 97.1% $^{77}$Se. The resolved hyperfine splitting at zero magnetic field of 1.68 GHz and the resolved Zeeman component at a magnetic field of 2750 G are shown in FIG. 2A. The level diagram describing the individual transitions is included in FIG. 2B.

Bismuth (Bi) is the deepest group-V donor in silicon, with a binding energy of ~71 meV. Furthermore, bismuth is monoisotopic ($^{209}$Bi) with a large l=9/2 nuclear spin and also a large hyperfine interaction of 1.475 GHz. At zero magnetic field, the neutral donor $D^0$ ground state is split into a doublet having total spins of 5 and 4, which are separated by 7.377 GHz, five times the hyperfine interaction. At a nonzero magnetic field, the donor bound exciton splits into six components according to the diagram shown in FIG. 3B, each of them having ten hyperfine subcomponents. The six components under magnetic field are determined by the electron spin and hole angular momentum analogous to the phosphorus donor.

Neutral and Ionized Impurities in Isotopically Pure Silicon

Impurities can be thermally or optically ionized, which involves, in the case of donor impurities, removing the donor electron from the impurity center and leaving the positively charged (ionized) donor behind. Many impurities are thermally ionized at room temperature. Therefore, to maintain them neutral, cooling may be needed. Impurities that remain neutral at room temperature can be optically ionized by applying above-bandgap light to the crystal. The specifics of the optical ionization/neutralization depend on the doping level of donors and acceptors present in the crystal. However, by turning on and off above-bandgap illumination provided by a laser can lead to ionization or neutralization of impurities. By ionizing the donors and removing hyperfine coupled electrons, the temperature dependence of the coherence time changes profoundly. For the phosphorus impurities in single-isotope silicon ($^{28}$Si), spin coherence times of 4 hours at cryogenic temperatures and 30 minutes at room temperatures have been observed. Achieving readout without significant broadening of the resonance by optical consecutive ionization/neutralization could lead to more sensitive magnetometers that are less sensitive to temperature.

Examples of a Silicon-Based Magnetometer

Figure 5:
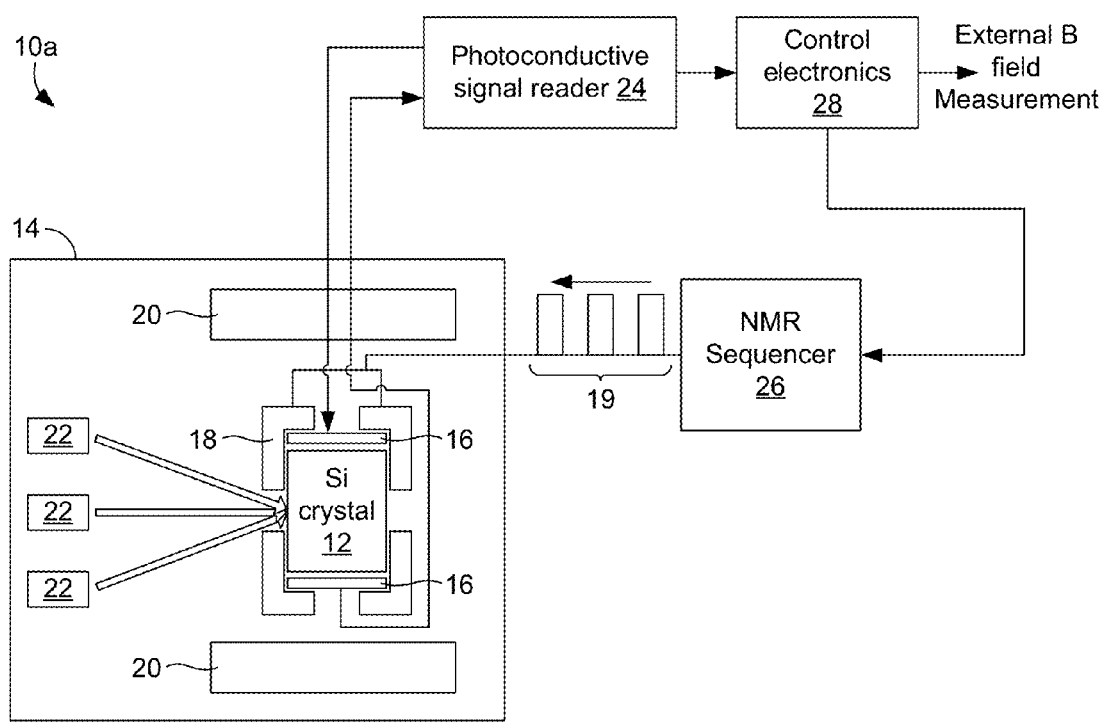
FIG. 5 is a block diagram of an embodiment of a silicon-based magnetometer using electrical detection.

FIG. 5 illustrates a non-limiting example of a silicon-based magnetometer 10a based at least in part on the properties and characteristics of the impurity transitions in $^{28}$Si, as discussed above. The silicon-based magnetometer 10a of FIG. 5 electrically detects the resonance of the hyperfine splitting levels and associated Larmor precession. When electrical detection is used, such as the photocurrent detection scheme discussed below, the change in photoconductivity resulting from Auger electrons is detected using a non-contact, capacitive photoconductivity approach. This non-contact approach eliminates any possibility of straining the crystal and also eliminates the need for ohmic contacts.

As shown in FIG. 5, the magnetometer 10a is based on impurity transitions in $^{28}$Si and comprises a single-isotope silicon crystal 12 that is doped with impurity atoms. The silicon crystal 12 can be supported on a suitable substrate (not shown) in a manner in which it is in an unstressed, strain-free state. Regardless, the silicon crystal 12 can, at least in some embodiments, be contained within a temperature-controlled housing 14. The housing can be cooled by an appropriate cooling apparatus (not shown), such as a thermoelectric cooling apparatus or a liquid gas cooling apparatus.

Placed at opposite ends or sides of the silicon crystal 12 are capacitor plates 16 that can be used to detect the Larmor precession hyperfine splitting resonance of impurity bound excitons. In particular, the capacitor plates 16 can be used to electrically detect the resonance as a change in photoconductivity. Because of the high efficiency of Auger recombination, the resonance can be detected when relatively few impurity atoms (e.g., ~$10^{12}$ to $10^{14}$ cm$^{-3}$) are present in the silicon crystal 12.

The silicon crystal 12 is further surrounded by a first magnetic coil 18 that can be used to probe or interrogate the hyperfine splitting. As described below, the first magnetic coil 18 can be energized using a nuclear magnetic resonance (NMR) sequence that comprises RF or microwave pulses 19 that cause the hyperfine splitting levels to resonate. In some embodiments, a pulse sequence is used that does not completely remove the phase accumulation associated with the environment. A second magnetic coil 20 can also surround the silicon crystal 12 that applies a constant magnetic field to the crystal that creates a small amount of Zeeman splitting.

The magnetometer 10a further includes one or more light sources 22 that can be used to excite the impurity atoms within the silicon crystal 12 and cause them to undergo the energy level transitions that result in the hyperfine splitting. In some embodiments, the light sources 22 are lasers, such as, for example, VCSELs or distributed feedback diode lasers. In some embodiments, the laser light has a wavelength in the near infrared (NIR) spectrum. When multiple light sources 22 are provided, one or more can be used to excite the impurity atoms, one or more can be used to interrogate the Larmor precession of the hyperfine splitting, and one or more can be used to optically ionize/neutralize the impurities. Ionizing the impurity in the case of a donor impurity refers to removing the donor electron from the donor atom.

As is further shown in FIG. 5, the magnetometer 10a also comprises a photoconductive signal reader 24 that sends signals to and receives signals from the capacitor plates 16, an NMR sequencer 26 that generates the NMR sequences for the first magnetic coil 18, and control electronics 28 that receive signals from the photoconductive signal reader and provides control signals to the NMR sequencer which can provide readings of the strength of the external magnetic field that is being measured.

During operation of the silicon-based magnetometer 10, the single-isotope silicon crystal 12 is maintained at a desired temperature within the housing 14 and a static magnetic field is applied to the crystal by the second magnetic coil 20. Light is emitted by a light source 22 that impinges upon the silicon crystal 12 so as to cause energy level transitions for the impurity atoms contained within the crystal. As a result of these transitions, hyperfine splitting occurs. The hyperfine splitting levels can be caused to resonate by energizing the first magnetic coil 18 with an NMR sequence generated by the NMR sequencer. That resonance and the Larmor precession associated with it can then be detected by the capacitor plates 16 as a change in photoconductivity, and the change can be read by the photoconductive signal reader 24. The photoconductive signal reader 24 can provide the reading to the control electronics 28, which can then convert it to a magnetic field strength. In addition, the control electronics 28 can provide control signals to the NMR sequencer 26 to alter the NMR sequences provided to the first magnetic coil 18.

Figure 6:
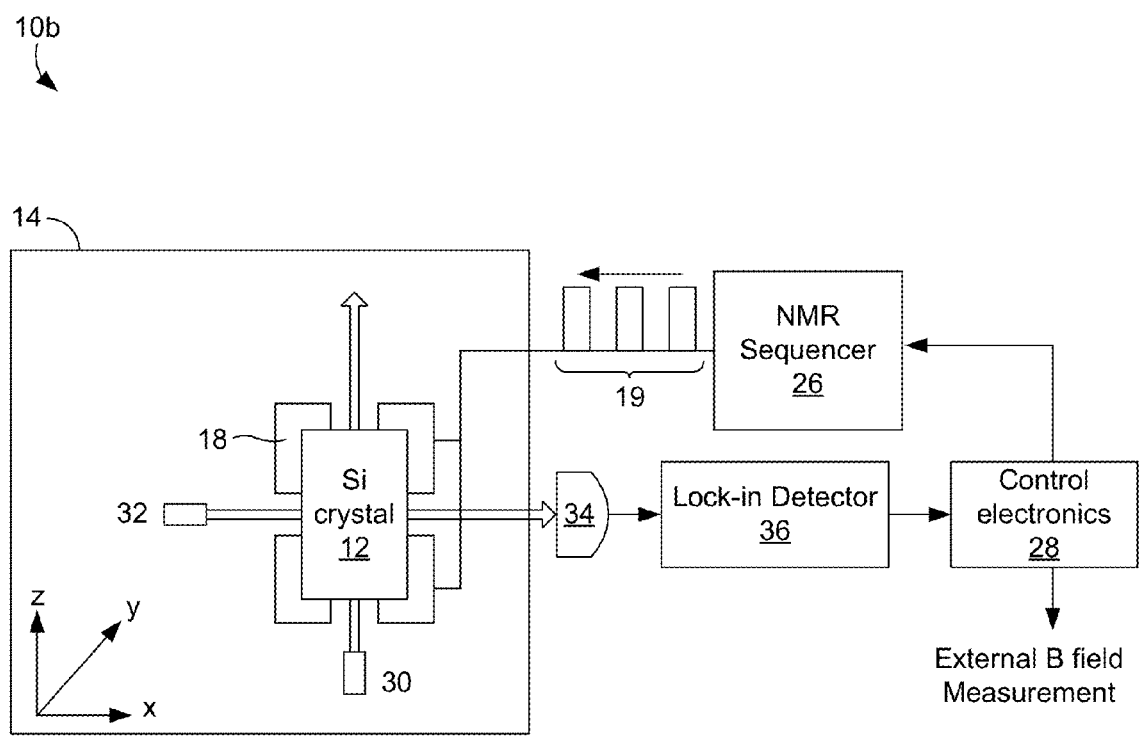
FIG. 6 is a block diagram of an embodiment of a silicon-based magnetometer using optical detection.

Referring next to FIG. 6, shown is another non-limiting example of a silicon-based magnetometer 10b for measuring a magnetic field that is based at least in part on the properties and characteristics of the impurity transitions in $^{28}$Si as discussed above. The silicon-based magnetometer 10b of FIG. 6 optically detects the resonance of the hyperfine splitting levels and the associated Larmor precession. As in FIG. 5, the magnetometer 10b is based on impurity transitions in $^{28}$Si and comprises a single-isotope silicon crystal 12 that is doped with impurity atoms. The silicon crystal 12 can be supported on a suitable substrate (not shown) in a manner in which it is in an unstressed, strain-free state. Regardless, the silicon crystal 12 can, at least in some embodiments, be contained within a temperature-controlled housing 14. The housing can be cooled by an appropriate cooling apparatus (not shown), such as a thermoelectric cooling apparatus or a liquid gas cooling apparatus.

The silicon crystal 12 is further surrounded by a first magnetic coil 18 that can be used to probe or interrogate the hyperfine splitting. As described below, the first magnetic coil 18 can be energized using a nuclear magnetic resonance (NMR) sequence that comprises RF or microwave pulses 19 that cause the hyperfine splitting levels to resonate. In some embodiments, a pulse sequence is used that does not completely remove the phase accumulation associated with the environment.

For optical detection, the magnetometer 10b further includes a pump light source 30 and a probe light source 32 used to pump and probe the silicon crystal 12. In some embodiments, the pump light source 30 and the probe light source 32 are lasers, such as, for example, VCSELs or distributed feedback diode lasers. In operation, the pump light source 30 can emit light onto the single-isotope silicon crystal 12 to can generate a spin polarized population of impurities inside the silicon crystal 12 in the z-direction. In some embodiments, the pump light source 30 may be circularly polarized by using a λ/4 wave plate to generate the spin polarized excitation. The external magnetic field to be measured along the y-direction rotates the polarization into the x-direction. The beam of the probe light source 32 along the x-direction detects this small rotation. The photodetector 34 detects the polarization of the probe beam and, therefore, the external B field along the y-direction can be measured simultaneously at adjacent points. The signal is not sensitive to small changes in the magnetic fields in the x- and z-directions and the device operates as a vector magnetometer. Signals from the photodetector 34 may be received by a lock-in detector 36, processed, and transmitted to control electronics 28. The control electronics 28 may receive signals from the lock-in detector 36 and provide control signals to the NMR sequencer 26. In addition, the signals received by the control electronics 28 include the readings of the strength of the external magnetic field that is being measured. Accordingly, the control electronics 28 compute the external magnetic field based at least in part on the received readings the strength of the external magnetic field.

Some embodiments of a silicon-based magnetometer 10b using optical detection may not include the second magnetic coil 20 as shown in the silicon-based magnetometer 10a of FIG. 5. Rather, a Bell-Bloom excitation scheme may be applied to the silicon crystal 12. As such, the spin precession is driven optically by modulating the frequency of the light from the pump light source 30 or amplitude at Larmor frequency instead of applying an RF field. Further, in some embodiments, the silicon-based magnetometer 10b using optical detection may be implemented so that the pumping and probing of the silicon crystal is done with a single optical field that has components laying both along and perpendicular to the magnetic field direction.

As can be appreciated from the above discussion, the resonance of the hyperfine splitting levels can be detected electrically, optically, or through a combination of the two. It should be noted that for miniaturizing the device, i.e., reducing the size of the single crystal down to nanometer scale would in one embodiment require the implementation of VCSELs and/or distributed feedback diode lasers.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A magnetometer, comprising:
a single-isotope silicon crystal doped with impurity atoms, wherein a Larmor precession associated with energy level transitions of the impurity atoms is detected and used to measure an external magnetic field, and wherein the Larmor precession is detected electrically based at least in part on a photoconductivity measurement of the single-isotope silicon crystal.

2. The magnetometer of claim 1, wherein the single-isotope silicon crystal is a $^{28}$Si crystal.

3. The magnetometer of claim 1, wherein the impurity atoms are single-isotope impurity atoms.

4. The magnetometer of claim 1, wherein the impurity atoms are selected from the group consisting of phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, and combinations thereof.

5. The magnetometer of claim 1, wherein the energy level transitions originate from neutral donors or acceptors of the impurity atoms.

6. The magnetometer of claim 1, further comprising a light source adapted to excite the impurity atoms within the silicon crystal.

7. The magnetometer of claim 6, further comprising an apparatus configured to interrogate hyperfine splitting resulting from an interaction of impurity nuclei and donor electrons.

8. The magnetometer of claim 1, further comprising at least two capacitor plates positioned at opposite ends of the single-isotope silicon crystal, the at least two capacitor plates adapted to measure photoconductivity.

9. The magnetometer of claim 1, wherein the magnetometer is operable at room temperature.

10. A method for measuring a magnetic field, the method comprising
applying light from one or more light sources onto a single-isotope silicon crystal to excite impurity atoms of the single-isotope silicon crystal;
detecting a Larmor precession associated with the impurity atoms of the single-isotope silicon crystal based at least in part on energy level transitions of the impurity atoms; and
calculating a magnetic field measurement based at least in part on the Larmor precession,
wherein detecting the Larmor precession comprises detecting changes in photoconductivity of the single-isotope silicon crystal.

11. The method of claim 10, wherein the single-isotope silicon crystal is a $^{28}$Si crystal.

12. The method of claim 10, wherein the impurity atoms are single-isotope impurity atoms.

13. The method of claim 10, wherein the impurity atoms are selected from the group consisting of phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, and combinations thereof.

14. The method of claim 10, wherein detecting the Larmor precession comprises detecting resonance of hyperfine splitting levels resulting from the energy level transitions originating from neutral donors or acceptors of the impurity atoms.

15. The method of claim 10, further comprising applying a nuclear magnetic resonance to the single-isotope silicon crystal to interrogate hyperfine splitting resulting from an interaction of impurity nuclei and donor electrons.

16. The method of claim 10, further comprising applying a pump laser and a probe laser to the single-isotope silicon crystal to optically detect the Larmor precession.

17. A magnetometer, comprising:
a single-isotope silicon crystal doped with impurity atoms, wherein a Larmor precession associated with energy level transitions of the impurity atoms is detected and used to measure an external magnetic field, and wherein the Larmor precession is detected optically.

18. The magnetometer of claim 17, further comprising a pump laser and a probe laser for optically detecting the Larmor precession, wherein the pump laser projects light onto the single-isotope silicon crystal in the z-direction and the probe laser projects light onto the single-isotope silicon crystal in the x-direction.

19. The magnetometer of claim 17, wherein the single-isotope silicon crystal is a $^{28}$Si crystal.

20. The magnetometer of claim 17, wherein the magnetometer is operable at room temperature.

* * * * *